US008903685B2

(12) United States Patent
Saeed et al.

(10) Patent No.: US 8,903,685 B2
(45) Date of Patent: Dec. 2, 2014

(54) VARIABLE STEP-SIZE LEAST MEAN SQUARE METHOD FOR ESTIMATION IN ADAPTIVE NETWORKS

(75) Inventors: Muhammad Omer Bin Saeed, Dhahran (SA); Azzedine Zerguine, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 517 days.

(21) Appl. No.: 13/286,172

(22) Filed: Oct. 31, 2011

(65) Prior Publication Data

US 2012/0109600 A1 May 3, 2012

Related U.S. Application Data

(63) Continuation-in-part of application No. 12/913,482, filed on Oct. 27, 2010, now Pat. No. 8,547,854.

(51) Int. Cl.
*G06F 17/10* (2006.01)
*H04W 84/18* (2009.01)
*H03H 21/00* (2006.01)

(52) U.S. Cl.
CPC ............. *G06F 17/10* (2013.01); *H04W 84/18* (2013.01); *H03H 21/0043* (2013.01); *H03H 2021/0056* (2013.01)
USPC .......................................................... 703/2

(58) Field of Classification Search
CPC ..... H04W 84/12; H04W 84/18; H04W 24/02; H04W 88/08; H04W 88/021; G06F 11/08; G06F 17/10
USPC ................ 703/2; 375/340; 709/224; 370/230
See application file for complete search history.

(56) References Cited

U.S. PATENT DOCUMENTS

| | | | |
|---|---|---|---|
| 5,546,459 A | 8/1996 | Sih et al. | |
| 5,887,059 A | 3/1999 | Xie et al. | |
| 6,026,121 A | 2/2000 | Sadjadpour | |
| 6,377,611 B1 | 4/2002 | Hwang | |
| 6,493,689 B2 * | 12/2002 | Kotoulas et al. | 706/23 |
| 6,741,707 B2 | 5/2004 | Ray et al. | |
| 6,977,912 B1 | 12/2005 | Porter et al. | |

(Continued)

FOREIGN PATENT DOCUMENTS

| | | |
|---|---|---|
| CN | 101222458 A | 7/2008 |
| CN | 101252559 A | 8/2008 |
| EP | 1054536 A2 | 11/2000 |
| KR | 20050001888 A | 1/2005 |

OTHER PUBLICATIONS

Amir Rastegarnia, Mohammad Ali Tinati and Azam Khalili, A Diffusion Least-Mean Square Algorithm for Distributed Estimation over Sensor Networks, World Academy of Science, Engineering and Technology vol. 2 Sep. 26, 2008, 5 pages.*

(Continued)

*Primary Examiner* — Kamini S Shah
*Assistant Examiner* — Luke Osborne
(74) *Attorney, Agent, or Firm* — Richard C. Litman

(57) ABSTRACT

The variable step-size least mean square method for estimation in adaptive networks uses a variable step-size to provide estimation for each node in the adaptive network, where the step-size at each node is determined by the error calculated for each node, as opposed to conventional least mean square algorithms used in adaptive filters and the like, where the choice of step-size reflects a tradeoff between misadjustment and the speed of adaptation.

1 Claim, 8 Drawing Sheets

(56) References Cited

U.S. PATENT DOCUMENTS

| | | | |
|---|---|---|---|
| 7,298,774 | B2 | 11/2007 | Miyata et al. |
| 2002/0041678 | A1 | 4/2002 | Basburg-Ertem et al. |
| 2004/0044712 | A1 | 3/2004 | Staszewski |
| 2005/0027494 | A1* | 2/2005 | Erdogmus et al. ............ 703/2 |
| 2005/0201457 | A1 | 9/2005 | Allred et al. |
| 2008/0136645 | A1 | 6/2008 | Lin et al. |
| 2008/0260141 | A1 | 10/2008 | Givens |

OTHER PUBLICATIONS

R.H. Kwong and E.W. Johnston, "A Variable Step Size LMS Algorithm", *IEEE Transactions on Signal Processing*, vol. 40, No. 7, Jul. 1992, 10 pages.

W.Y. Chen and R.A. Haddad, "A Variable Step Size LMS Algorithm", *Circuits and Systems,1990, Proceedings of the 33rd Midwest Symposium on*, Aug. 12-14, 1990, vol. 1, pp. 423-426.

M.O. Bin Saeed, A. Zerguine and S.A. Zummo, "Variable Step-Size Least Mean Square Algorithms Over Adaptive Networks", *10$^{th}$ International Conference on Information Science, Signal Processing and their Applications* (ISSPA 2010), May 2010, pp. 381-384.

M.S.E. Abadi, S.Z. Moussavi and A.M. Far, "Variable, Step-Size, Block Normalized, Least Mean, Square Adaptive Filter: A Unified Framework", *Scientia Iranica*, vol. 15, No. 2, pp. 195-202, Apr. 2008.

Lopes, C.G.; Sayed, A.H., "Incremental Adaptive Strategies Over Distributed Networks", *IEEE Transactions on Signal Processing*, vol. 55, No. 8, Aug. 2007.

Cattivelli, F.; Sayed, A.H., "Diffusion LMS Strategies for Distributed Estimation", *IEEE Transactions on Signal Processing*, vol. 58, No, 3, Mar. 2010, 14 pages.

Cattivelli, F.; Sayed, A.H., "Diffusion LMS-Based Distributed Detection over Adaptive Networks", *Signals, Systems and Computers, 2009 Conference Record of the Forty-Third Asilomar Conference on*, Nov. 1-4, 2009, pp. 171-175.

Bin Saeed, M.O.; Zerguine, A.; Zummo S.A., "Noise Constrained Diffusion Least Mean Squares Over Adaptive Networks", *2010 IEEE 21$^{st}$ International Symposium on Personal Indoor and Mobile Radio Communications*, Sep. 26-30, 2010, pp. 282-292.

* cited by examiner

VARIABLE STEP-SIZE LEAST MEAN SQUARE METHOD FOR ESTIMATION IN ADAPTIVE NETWORKS

CROSS-REFERENCE TO RELATED APPLICATION

This application is a continuation-in-part of U.S. patent application Ser. No. 12/913,482, filed on Oct. 27, 2010.

BACKGROUND OF THE INVENTION

1. Field of the Invention

The present invention relates generally to sensor networks and, particularly, to wireless sensor networks in which a plurality of wireless sensors are spread over a geographical location. More particularly, the invention relates to estimation in such a network utilizing a variable step-size least mean square method for estimation.

2. Description of the Related Art

In reference to wireless sensor networks, the term "diffusion" is used to identify the type of cooperation between sensor nodes in the wireless sensor network. That data that is to be shared by any sensor is diffused into the network in order to be captured by its respective neighbors that are involved in cooperation.

Wireless sensor networks include a plurality of wireless sensors spread over a geographic area. The sensors take readings of some specific data and, if they have the capability, perform some signal processing tasks before the data is collected from the sensors for more detailed thorough processing.

A "fusion-center based" wireless network has sensors transmitting all the data to a fixed center, where all the processing takes place. An "ad hoc" network is devoid of such a center and the processing is performed at the sensors themselves, with some cooperation between nearby neighbors of the respective sensor nodes.

Recently, several algorithms have been developed to exploit this nature of the sensor nodes and cooperation schemes have been formalized to improve estimation in sensor networks.

Least mean squares (LMS) algorithms are a class of adaptive filters used to mimic a desired filter by finding the filter coefficients that relate to producing the least mean squares of the error signal (i.e., the difference between the desired and the actual signal). The LMS algorithm is a stochastic gradient descent method, in that the filter is only adapted based on the error at the current time.

FIG. 2 diagrammatically illustrates an adaptive network having N nodes. In the following, boldface letters are used to represent vectors and matrices and non-bolded letters represent scalar quantities. Matrices are represented by capital letters and lower-case letters are used to represent vectors. The notation $(.)^T$ stands for transposition for vectors and matrices, and expectation operations are denoted as $E[.]$. FIG. 2 illustrates an exemplary adaptive network having N nodes, where the network has a predefined topology. For each node k, the number of neighbors is given by $N_k$, including the node k itself, as shown in FIG. 2. At each iteration i, the output of the system at each node is given by:

$$d_k(i) = u_{k,i} w^0 + v_k(i), \quad (1)$$

where $u_{k,i}$ is a known regressor row vector of length M, $w^0$ is an unknown column vector of length M, and $v_k(i)$ represents noise. The output and regressor data are used to produce an estimate of the unknown vector, given by $\psi_{k,i}$.

The adaptation can be performed using two different techniques. The first technique is the Incremental Least Mean Squares (ILMS) method, in which each node updates its own estimate at every iteration and then passes on its estimate to the next node. The estimate of the last node is taken as the final estimate of that iteration. The second technique is the Diffusion LMS (DLMS), where each node combines its own estimate with the estimates of its neighbors using some combination technique, and then the combined estimate is used for updating the node estimate. This method is referred to as Combine-then-Adapt (CTA) diffusion. It is also possible to first update the estimate using the estimate from the previous iteration and then combine the updates from all neighbors to form the final estimate for the iteration. This method is known as Adapt-then-Combine (ATC) diffusion. Simulation results show that ATC diffusion outperforms CTA diffusion.

Using LMS, the ATC diffusion algorithm is given by:

$$\begin{cases} f_{k,i} = y_{k,i-1} + \mu_k u_{k,i}^T (d_k(i) - u_{k,i} y_{k,i-1}) \\ y_{k,i} = \sum_{l \in N_k} c_{lk} f_{l,i} \end{cases} \quad (2)$$

where $\{c_{lk}\}_{l \in N_k}$ is a combination weight for node k, which is fixed, and $\{f_{l,i}\}_{l \in N_k}$ is the local estimate for each node neighboring node k, and $\mu_k$ is the node step-size.

The conventional Diffusion Lease Mean Square (LMS) technique uses a fixed step-size, which is chosen as a trade-off between steady-state misadjustment and speed of convergence. A fast convergence, as well as low steady-state misadjustment, cannot be achieved with this technique.

Thus, a variable step-size least mean square method for estimation in adaptive networks solving the aforementioned problems is desired.

SUMMARY OF THE INVENTION

The variable step-size least mean square method for estimation in adaptive networks uses a variable step-size to provide estimation for each node in the adaptive network, where the step-size at each node is determined by the error calculated for each node. This is in contrast to conventional least mean square algorithms used in adaptive filters and the like, in which the choice of step-size reflects a tradeoff between misadjustment and the speed of adaptation.

In a first embodiment, a variable step-size incremental least mean square method for estimation in adaptive networks is given by the following steps: (a) establishing a network having N nodes, where N is an integer greater than one, and establishing a Hamiltonian cycle among the nodes such that each node is connected to two neighboring nodes, one from which it receives data and one to which it transmits data; (b) establishing an integer/and initially setting i=1; (c) calculating an output of the adaptive network at each node k as $d_k(i) = u_{k,i} w^0 + v_k(i)$, where $u_{k,i}$ represents a known regressor row vector of length M, $w^0$ represents an unknown column vector of length M and $v_k(i)$ represents noise in the adaptive network, where M is an integer; (d) calculating an error value $e_k(i)$ at each node k as $e_k(i) = d_k(i) - u_{k,i} y_{k-1,i}$, where $y_{k,i}$ represents an estimate of an output vector for each node k at iteration i; (e) calculating a node step size $\mu_k$ for each node k as $\mu_k(i) = \alpha \mu_k(i-1) + \gamma e^2(i)$, where $\alpha$ and $\gamma$ are unitless, selectable parameters; (f) calculating an estimate of an output vector $y_{k,i}$ for each node k as $y_{k,i} = y_{k-1,i} + \mu_k(i) u_{k,i}^T (d_k(i) - u_{k,i} y_{k-1,i})$; (g) if $e_k(i)$ is greater than a selected error threshold, then setting i=i+1 and returning to step (c); otherwise, (h) defining a set of output vectors $y_k$ for each node k, where $y_k = y_{k,i}$ and (i) storing the set of output vectors in computer readable memory.

In an alternative embodiment, a variable step-size diffusion least mean square method for estimation in adaptive networks is given by the following steps: (a) establishing an adaptive network having N nodes, where N is an integer greater than one, and for each node k, a number of neighbors of node k is given by $N_k$, including the node k, where k is an integer between one and N; (b) establishing an integer i and initially setting i=1; (c) calculating an output of the adaptive network at each node k as $d_k(i) = u_{k,i} w^0 + v_k(i)$, where $u_{k,i}$ represents a known regressor row vector of length M, $w^0$ represents an unknown column vector of length M and $v_k(i)$ represents noise in the adaptive network, where M is an integer; (d) calculating an error value $e_k(i)$ at each node k as $e_k(i) = d_k(i) - u_{k,i} y_{k,i-1}$, where $y_{k,i}$ represents an estimate of an output vector for each node k at iteration i; (e) calculating a node step size $\mu_k$ for each node k as $\mu_k(i) = \alpha \mu_k(i-1) + \gamma e^2(i)$, where $\alpha$ and $\gamma$ are unitless, selectable parameters; (f) calculating a local estimate for each node neighboring node k, $f_{k,i}$, for each node k as $f_{k,i} = y_{k,i-1} + \mu_k(i) u_{k,i}^T (d_k(i) - u_{k,i} y_{k,i-1})$; (g) calculating an estimate of an output vector $y_{k,i}$ for each node k as $$y_{k,i} = \sum_{l=1}^{N_k} c_{lk} f_{l,i},$$

where l is an integer, $c_{lk}$ represents a combination weight for node k, which is fixed; (h) if $e_k(i)$ is greater than a selected error threshold, then setting i=i+1 and returning to step (c); otherwise, (i) defining a set of output vectors $y_k$ for each node k, where $y_k = y_{k,i}$; and (j) storing the set of output vectors in computer readable memory.

In a further alternative embodiment, the variable step-size diffusion least mean square method for estimation in adaptive networks is given by the following steps: (a) establishing an adaptive network having N nodes, where N is an integer greater than one, and for each node k, a number of neighbors of node k is given by $N_k$, including the node k, where k is an integer between one and N; (b) establishing an integer i and initially setting i=1; (c) calculating an output of the adaptive network at each node k as $d_k(i) = u_{k,i} w^0 + v_k(i)$, where $u_{k,i}$ represents a known regressor row vector of length M, $w^0$ represents an unknown column vector of length M and $v_k(i)$ represents noise in the adaptive network, where M is an integer; (d) calculating an error value $e_k(i)$ at each node k as $e_k(i) = d_k(i) - u_{k,i} y_{k,i-1}$, where $y_{k,i}$ represents an estimate of an output vector for each node k at iteration i; (e) calculating a node step size $\mu_k$ for each node k as $$\mu_k(i) = \alpha \mu_k(i-1) + \gamma \sum_{l \in N_k} b_{lk} e_l^2(i),$$

where $\alpha$ and $\gamma$ are unitless, selectable parameters, l is an integer, and $b_{lk}$ is a combiner weight for sensed data shared by neighbor nodes of node k; (f) calculating a local estimate for each node neighboring node k, $f_{k,i}$, for each node k as $$f_{k,i} = y_{k,i-1} + \mu_k(i) \sum_{l \in N_k} b_{lk} u_l^T(i) e_l(i);$$

(g) calculating the estimate of the output vector $y_{k,i}$ for each node k as $$y_{k,i} = \sum_{l=1}^{N_k} c_{lk} f_{l,i},$$

where $c_{lk}$ is a combiner coefficient equal to $$\frac{1}{\max(N_k, N_l)}$$

when nodes k and l are linked and k does not equal l, $c_{lk}$ is equal to 0 when nodes k and l are not linked, and $c_{lk}$ is equal to $$1 - \sum_{l \in N_k / \{k\}} c_{kl}$$

when k equals l; (h) if $e_k(i)$ is greater than a selected error threshold, then setting i=i+1 and returning to step (c); otherwise, (i) defining a set of output vectors $y_k$ for each node k, where $y_k = y_{k,i}$; and (j) storing the set of output vectors in computer readable memory.

In a still further alternative embodiment, the variable step-size diffusion least mean square method for estimation in adaptive networks is given by the following steps: (a) establishing an adaptive network having N nodes, where N is an integer greater than one, and for each node k, a number of neighbors of node k is given by $N_k$, including the node k, where k is an integer between one and N; (b) establishing an integer i and initially setting 1=1; (c) calculating an output of the adaptive network at each node k as $d_k(i) = u_{k,i} w^0 + v_k(i)$, where $u_{k,i}$ represents a known regressor row vector of length M, $w^0$ represents an unknown column vector of length M and $v_k(i)$ represents noise in the adaptive network, where M is an integer; (d) calculating an error value $e_k(i)$ at each node k as $e_k(i) = d_k(i) - u_{k,i} y_{k,i-1}$, where $y_{k,i}$ represents an estimate of an output vector for each node k at iteration i; (e) calculating a diffused error value $\varepsilon_k(i)$ at each node k as $$\varepsilon_k(i) = \sum_{l \in N_k} c_{lk} e_l(i),$$

where l is an integer, $c_{lk}$ is a combiner coefficient equal to $$\frac{1}{\max(N_k, N_l)}$$

when nodes k and l are linked and k does not equal l, $c_{lk}$ is equal to 0 when nodes k and l are not linked, and $c_{lk}$ is equal to $$1 - \sum_{l \in N_k / \{k\}} c_{kl}$$

when k equals 1, (f) calculating a node step size $\mu_k$ for each node k as $$\mu_k(i) = \alpha \mu_k(i-1) + \gamma \sum_{l \in N_k} b_{lk} \varepsilon_l^2(i),$$

where $\alpha$ and $\gamma$ are unitless, selectable parameters and $b_{lk}$ is a combiner weight for sensed data shared by neighbor nodes of node k; (g) calculating a local estimate for each node neighboring node k, $f_{k,i}$, for each node k as $$f_{k,i} = y_{k,i-1} + \mu_k(i) \sum_{l \in N_k} b_{lk} u_l^T(i) e_l(i);$$

(h) calculating the estimate of the output vector $y_{k,i}$ for each node k as $$y_{k,i} = \sum_{l=1}^{N_k} c_{lk} f_{l,i};$$

(i) if $e_k(i)$ is greater than a selected error threshold, then setting i=i+1 and returning to step (c); otherwise, (j) defining a set of output vectors $y_k$ for each node k, where $y_k = y_{k,i}$; and (k) storing the set of output vectors in computer readable memory.

These and other features of the present invention will become readily apparent upon further review of the following specification.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
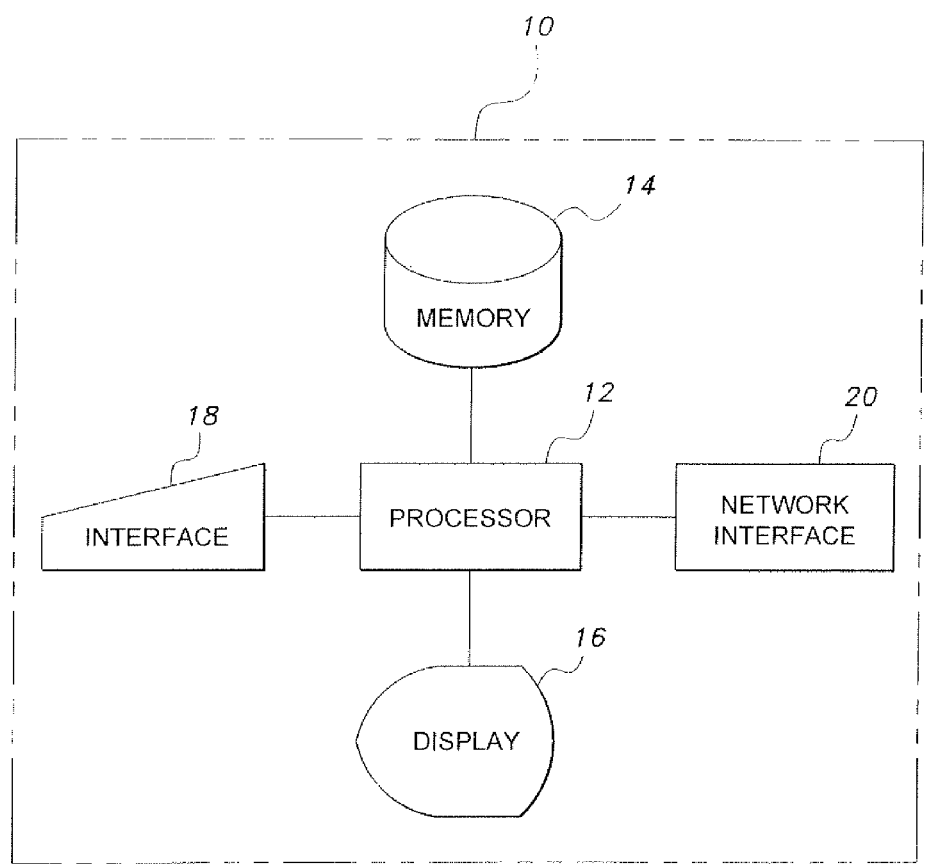
FIG. 1 is a block diagram of a system for implementing a variable step-size least mean square method for estimation in adaptive networks according to the present invention.
Figure 2:
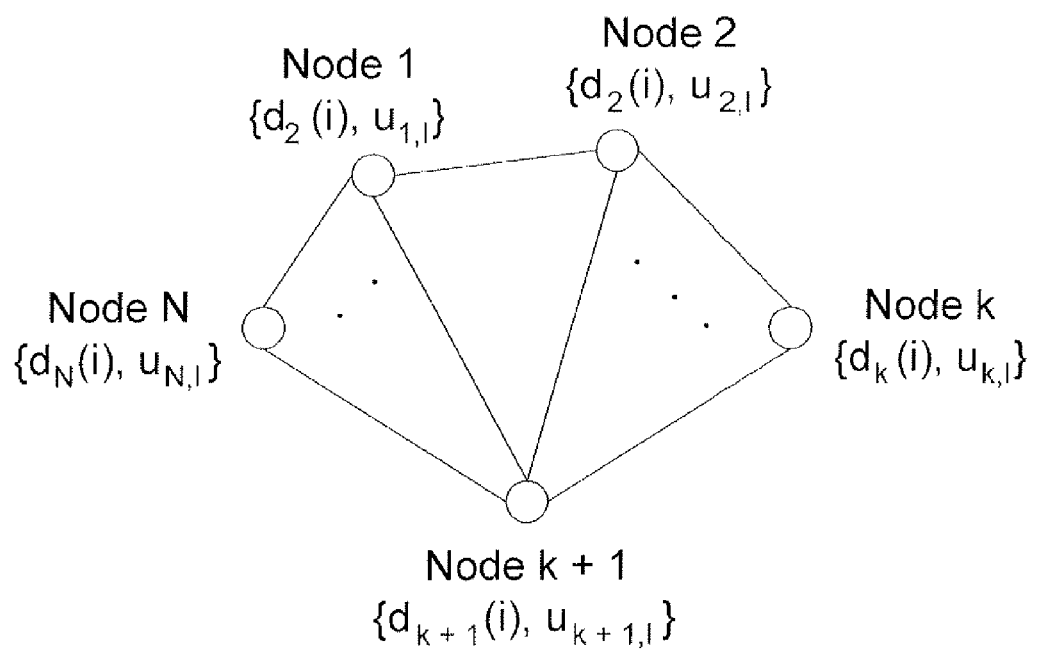
FIG. 2 is a diagram schematically illustrating an adaptive network with N nodes.

The variable step-size least mean square method for estimation in adaptive networks uses a variable step-size to provide estimation for each node in the adaptive network, where the step-size at each node is determined by the error calculated for each node. This is in contrast to conventional least mean square algorithms used in adaptive filters and the like, in which the choice of step-size reflects a tradeoff between misadjustment and the speed of adaptation. An example of a conventional LMS algorithm is shown in chapter ten of A. H. Sayed, *Adaptive Filters*, New York: Wiley, 2008, pgs. 163-166. An example of a variable step-size LMS algorithm is shown in R. H. Kwong and E. W. Johnston, "A Variable Step Size LMS Algorithm", *IEEE Transactions on Signal Processing*, Vol. 40, No 7, July 1992, each of which is herein incorporated by reference in its entirety.

In a first, incremental variable step-size least mean square method, the estimate of the unknown vector $y_{k,i}$ is given by:

$$y_{k,i} = y_{k-1,i} + \mu_k(i) u_{k,i}^T (d_k(i) - u_{k,i} y_{k-1,i}). \tag{3}$$

Every node updates its estimate based on the updated estimate coming from the previous node. The error is given by:

$$e_k(i) = d_k(i) - u_{k,i} y_{k-1,i}. \tag{4}$$

The node step size $\mu_k$ is given by:

$$\mu_k(i) = \alpha \mu_k(i-1) + \gamma e^2(i) \tag{5}$$

where $\alpha$ and $\gamma$ are controlling parameters. Updating equation (3) with the step-size given by equation (5) results in the variable step-size incremental least mean square method defined by the following recursion:

$$y_{k,i} = y_{k-1,i} + \mu_k(i) u_{k,i}^T (d_k(i) - u_{k,i} y_{k-1,i}). \tag{6}$$

Thus, the variable step-size incremental least mean square method is given by the following steps: (a) establishing an adaptive network having N nodes, where N is an integer greater than one, and for each node k, a number of neighbors of node k is given by $N_k$, including the node k, where k is an integer between one and N, and establishing a Hamiltonian cycle among the nodes such that each node is connected to two neighboring nodes, each node receiving data from one of the neighboring nodes and transmitting data to the other neighboring node; (b) establishing an integer i and initially setting i=1; (c) calculating an output of the adaptive network at each node k as $d_k(i) = u_{k,i} w^0 + v_k(i)$, where $u_{k,i}$ represents a known regressor row vector of length M, $w^0$ represents an unknown column vector of length M and $v_k(i)$ represents noise in the adaptive network, where M is an integer; (d) calculating an error value $e_k(i)$ at each node k as $e_k(i) = d_k(i) - u_{k,i} y_{k-1,i}$; (e) calculating a node step size for each node k as $\mu_k(i)=\alpha\mu_k(i-1)+\gamma e^2(i)$; (f) calculating an estimate of an output vector $y_{k,i}$ for each node k as $y_{k,i}=y_{k-1,i}+\mu_k(i)u_{k,i}{}^T(d_k(i)-u_{k,i}y_{k-1,i})$; (g) if $e_k(i)$ is greater than a selected error threshold, then setting i=i+1 and returning to step (c); otherwise, (h) defining a set of output vectors $y_k$ for each node k, where $y_k=y_{k,i}$; and (i) storing the set of output vectors in computer readable memory.

In an alternative embodiment, a second, diffusion variable step-size least mean square method of estimation is used. The diffusion variable step-size least mean square method of estimation is based upon equation set (2), and the error is given by:

$$e_k(i)=d_k(i)-u_{k,i}y_{k,i-1}. \qquad (7)$$

Applying this error to equation (5) yields the following update equations:

$$\begin{cases} f_{k,i} = y_{k,i-1} + \mu_k(i)u_{k,i}^T(d_k(i) - u_{k,i}y_{k,i-1}) \\ y_{k,i} = \sum_{l \in N_k} c_{lk} f_{l,i} \end{cases}. \qquad (8)$$

Thus, the variable step-size diffusion least mean square method is given by the following steps: (a) establishing an adaptive network having N nodes, where N is an integer greater than one, and for each node k, a number of neighbors of node k is given by $N_k$, including the node k, where k is an integer between one and N; (b) establishing an integer l and initially setting i=1; (c) calculating an output of the adaptive network at each node k as $d_k(i)=u_k w^0+v_k(i)$, where $u_{k,i}$ represents a known regressor row vector of length M, $w^0$ represents an unknown column vector of length M and $v_k(i)$ represents noise in the adaptive network, where M is an integer; (d) calculating an error value $e_k(i)$ at each node k as $e_k(i)=d_k(i)-u_{k,i}y_{k,i-1}$; (e) calculating a node step size for each node k as $\mu_k(i)=\alpha\mu_k(i-1)+\gamma e^2(i)$; (f) calculating a local estimate for each node neighboring node k, $f_{k,i}$, for each node k as $f_{k,i}=y_{k,i-1}+\mu_k u_{k,i}{}^T(d_k(i)-u_{k,i}y_{k,i-1})$; (g) calculating an estimate of an output vector $y_{k,i}$ for each node k as $$y_{k,i} = \sum_{l=1}^{N_k} c_{lk} f_{l,i},$$

where l is an integer, $c_{lk}$ represents a combination weight for node k, which is fixed; (h) if $e_k(i)$ is greater than a selected error threshold, then setting i=i+1 and returning to step (c); otherwise, (i) defining a set of output vectors $y_k$ for each node k, where $y_k=y_{k,i}$; and (j) storing the set of output vectors in computer readable memory.

In order to perform a performance analysis of the variable step-size incremental least mean square method, the variance relation is given by:

$$E[\|\bar{y}_k\|_S^2]=E[\|\bar{y}_{k-1}\|_S^2]+\mu_k^2\sigma_{v,k}^2 Tr(L_k\bar{S}) \qquad (9)$$

$$\bar{S}'=\bar{S}-\mu_k(L_k\bar{S}+\bar{S}L_k)+\mu_k^2(L_k Tr(\bar{S}L_k)+2L_k\bar{S}L_k) \qquad (10)$$

where $\bar{S}$ is a Gaussian normalized weighting matrix, $L_k$ is a diagonal matrix containing the eigenvalues for the regressor vector at node k, and $\sigma_{v,k}^2$ is the noise variance. Equations (9) and (10) show how the variance of the Gaussian normalized error vector $\bar{y}_k$ iterates from node to node. When equation (5) is incorporated into the results, an independence assumption is invoked, resulting in the following:

$$E[\mu_k(i)u_{k,i}{}^T e_k(i)]=E[\mu_k(i)]E[u_{k,i}{}^T e_k(i)], \qquad (11)$$

thus yielding the following new recursions, respectively, from equations (9) and (10):

$$E[\|\bar{y}_k^i\|_S^2] = E[\|\bar{y}_{k-1}^i\|_{\bar{S}'}^2] + E[\mu_{k,i-1}^2]\sigma_{v,k}^2 Tr(L_k\bar{S}) \qquad (12)$$

$$\bar{S}' = \bar{S} - E[\mu_{k,i-1}](L_k\bar{S}+\bar{S}L_k) + E[\mu_{k,i-1}^2](L_k Tr(\bar{S}L_k)+2L_k\bar{S}L_k). \qquad (13)$$

At steady state, the step-size expectation values in equations (12) and (13), $\bar{\mu}=E\mu_{k,\infty}$ and $\bar{\mu}^2=E\mu_{k,\infty}^2$, respectively, are given by:

$$\bar{\mu}_k = \frac{\gamma(M_k + \sigma_{v,k}^2)}{1-\alpha} \qquad (14)$$

$$\bar{\mu}_k^2 = \frac{2\alpha\gamma\bar{\mu}(\sigma_{v,k}^2+M_k)+3\gamma^2(\sigma_{v,k}^2+M_k)^2}{1-\alpha^2} \qquad (15)$$

where M is the steady-state misadjustment for the step-size, given by:

$$M_k = \sqrt{\frac{1-\left[1-2\frac{(3-\alpha)\gamma\sigma_{v,k}^2}{1-\alpha^2}Tr(L)\right]}{1+\left[1-2\frac{(3-\alpha)\gamma\sigma_{v,k}^2}{1-\alpha^2}Tr(L)\right]}}. \qquad (16)$$

The above can be directly incorporated into steady-state equations for calculation of mean square deviation (MSD) and excess mean square error (EMSE) in order to obtain the values of MSD and EMSE. Similarly, the variance relation for the variable step-size diffusion least mean square method is given by:

$$E[\|\bar{y}^i\|_{\bar{s}}^2] = E[\|\bar{y}^{i-1}\|_{\bar{F}_s}^2] + b^T\bar{s} \qquad (17)$$

$$\bar{F} = (\bar{G}^T e\bar{G}^*)[I_{N^2M^2} - (I_{NM}eLD) - (LDeI_{NM}) + (DeD)A], \qquad (18)$$

where $$\bar{s}=\text{bvec}\{\bar{S}\}, \text{ and} \qquad (19)$$

$$b=\text{bvec}\{R_v D^2 L\} \qquad (20)$$

where $R_v$ is the noise auto-correlation matrix, bvec$\{.\}$ is the block vectorization operator, D is the block diagonal step-size matrix for the whole network, $\bar{G}$ is the block combiner matrix, A is the block vectorized form of the fourth order weighted moment of the regressor vectors, and e is the block Kronecker product. Applying equation (11), equations (18) and (20) respectively yield:

$$\bar{F}=(\bar{G}^T e \bar{G}^*)[I_{N^2M^2}-(I_{NM}eLE[D])-(LE[D]eI_{NM})+E[DeD]A]] \qquad (21)$$

$$b=\text{bvec}\{R_v E[D^2]L\}. \qquad (22)$$

Since the step-size matrix is block-diagonal, the above operations are relatively straightforward. Steady-state matrices may be formed for the step-sizes using equations (14) and (15). Using these matrices directly in the steady-state equations provides the MSD and EMSE values for the variable step-size diffusion least mean square method.

Figure 3:
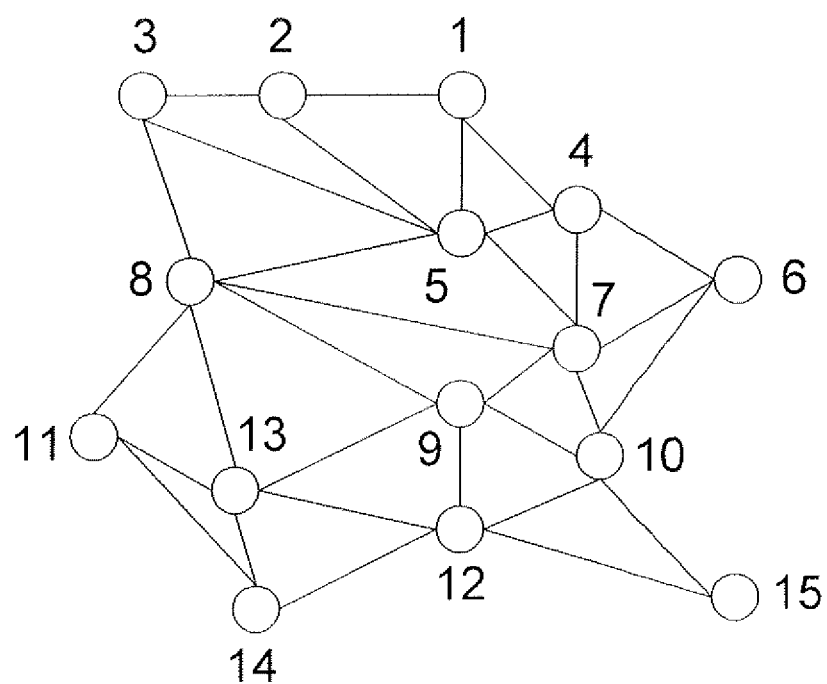
FIG. 3 is a diagram schematically illustrating network topology for an exemplary simulation of the variable step-size least mean square method for estimation in adaptive networks according to the present invention.
Figure 4A:
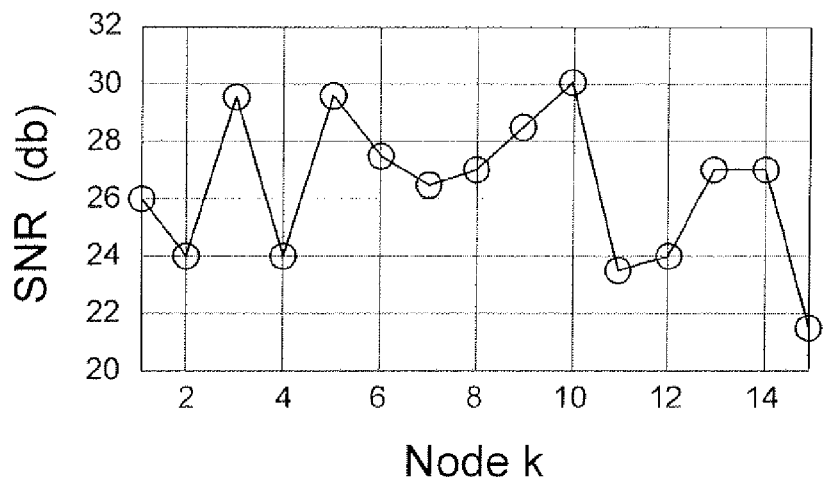
FIG. 4A is a graph of signal-to-noise ratio as chosen for simulation at each node in the exemplary simulation of FIG. 3.
Figure 4B:
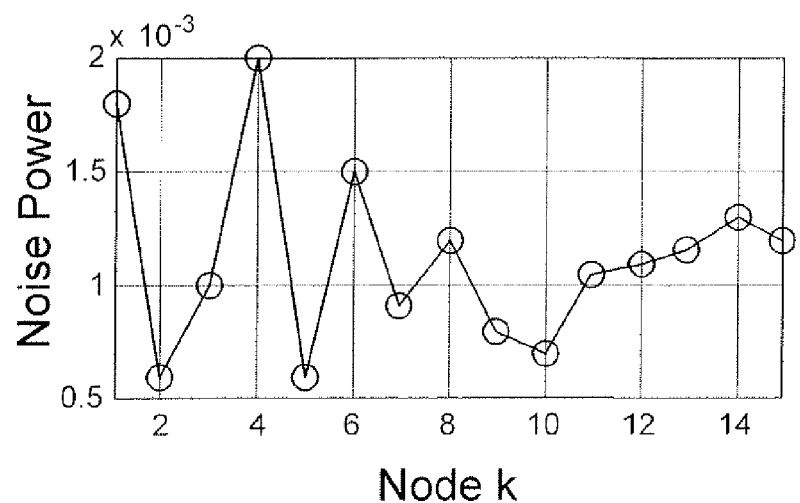
FIG. 4B is a graph of simulated values of noise power at each node in the exemplary simulation of FIG. 3.

In the below, simulation examples are described to illustrate the performance of the variable step-size LMS methods over adaptive networks. Results are compared with conventional fixed-step LMS methods. A network topology with N=15 nodes is considered in FIG. 3. For the variable step-size incremental LMS method, α is set to 0.997 and γ is set to $2\times10^{-4}$. For the variable step-size diffusion LMS method, α is set to 0.998 and γ is set to $2\times10^{-5}$. These exemplary values ensure that the convergence rate is the same for all methods. Two distinct scenarios are presented in the below results. In the first scenario, the signal-to-noise (SNR) and the noise power profile are shown in FIGS. 4A and 4B, respectively. In the second scenario, the noise power for Node 5 is increased from $6\times10^{-4}$ to $1\times10^{-2}$, which reduces the SNR to approximately 18 dB. As a result, there is a visible deterioration in performance.

Figure 5A:
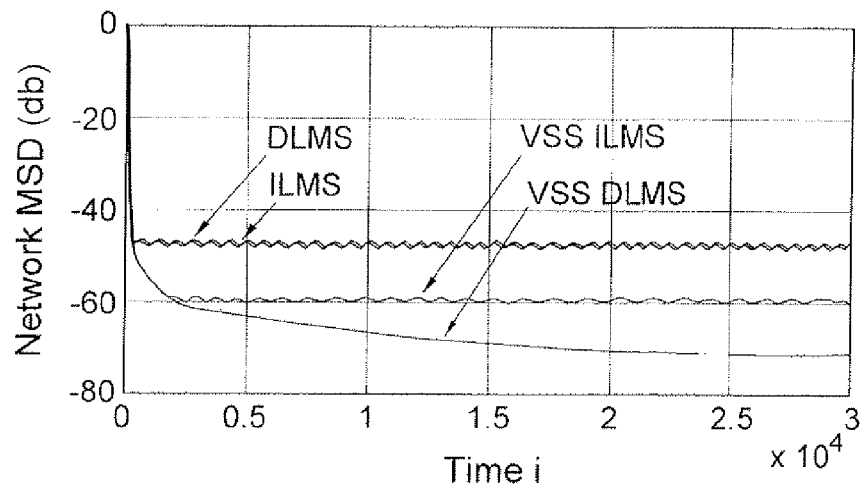
FIGS. 5A and 5B are comparison plots illustrating mean square deviation as a function of time for two exemplary scenarios using the variable step-size least mean square method for estimation in adaptive networks according to the present invention.
Figure 5B:
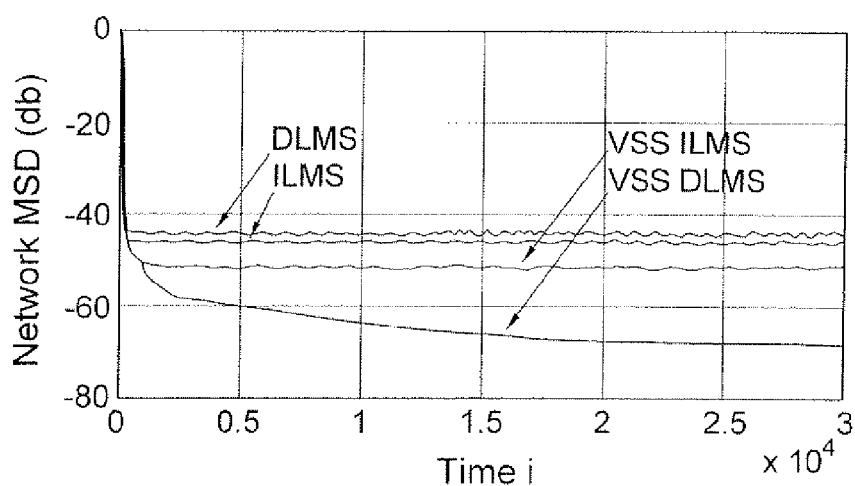

FIG. 5A illustrates the results obtained for the first scenario. As can be seen in FIG. 5A, there is a great improvement in performance obtained through the usage of both incremental and diffusion variable step-size LMS methods. There is an approximately 25 dB difference in favor of the variable step-size diffusion LMS method, compared to the conventional fixed step-size method. In the second scenario, the performance of the variable step-size diffusion LMS method deteriorates only by approximately 3 dB, whereas that of the variable step-size incremental LMS method deteriorates by nearly 9 dB, as shown in FIG. 5B.

Figure 6A:
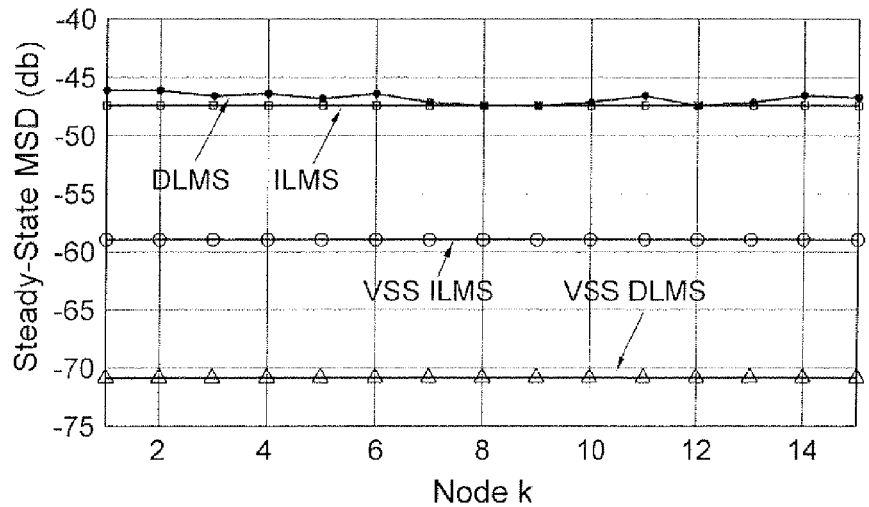
FIGS. 6A and 6B are comparison plots illustrating steady-state mean square deviations at each node for the exemplary scenarios of FIGS. 5A and 5B, respectively.
Figure 6B:
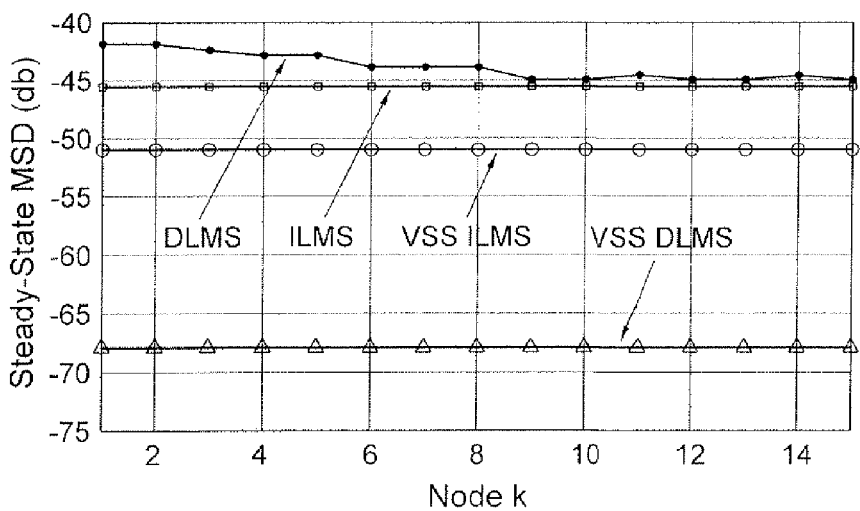

FIGS. 6A and 6B illustrate the steady-state MSD values at each node for both the incremental and diffusion methods, with the variable step-size diffusion LMS method being shown to be superior to both the incremental method and the fixed step-size conventional LMS method.

FIG. 1 illustrates a generalized system 10 for implementing the variable step-size least mean square method for estimation in adaptive networks, although it should be understood that the generalized system 10 may represent a stand-alone computer, computer terminal, portable computing device, networked computer or computer terminal, or networked portable device. Data may be entered into the system 10 by the user via any suitable type of user interface 18, and may be stored in computer readable memory 14, which may be any suitable type of computer readable and programmable memory. Calculations are performed by the processor 12, which may be any suitable type of computer processor, and may be displayed to the user on the display 16, which may be any suitable type of computer display. The system 10 preferably includes a network interface 20, such as a modem or the like, allowing the computer to be networked with either a local area network or a wide area network.

The processor 12 may be associated with, or incorporated into, any suitable type of computing device, for example, a personal computer or a programmable logic controller. The display 16, the processor 12, the memory 14, the user interface 18, network interface 20 and any associated computer readable media are in communication with one another by any suitable type of data bus, as is well known in the art. Additionally, other standard components, such as a printer or the like, may interface with system 10 via any suitable type of interface.

Examples of computer readable media include a magnetic recording apparatus, an optical disk, a magneto-optical disk, and/or a semiconductor memory (for example, RAM, ROM, etc.). Examples of magnetic recording apparatus that may be used in addition to memory 14, or in place of memory 14, include a hard disk device (HDD), a flexible disk (ED), and a magnetic tape (MT). Examples of the optical disk include a DVD (Digital Versatile Disc), a DVD-RAM, a CD-ROM (Compact Disc-Read Only Memory), and a CD-R (Recordable)/RW.

An alternative expression for equation set (8) may be given as:

$$y_k(i+1) = w_k(i) + \mu_k(i)u_k^T(i)e_k(i); \text{ and} \tag{23}$$

$$w_k(i+1) = \sum_{l \in N_k} c_{lk} y_l(i+1), \tag{24}$$

where $y_k(i)$ is the intermediate local estimate at node k at time instant i, $\mu_k$ is the step size associated with the $k^{th}$ node, and $c_{lk}$ represents the combiner coefficient. Various choices for combiner coefficients are possible. In the present method, the Metropolis combiner rule is used, such that:

$$c_{lk} = \begin{cases} \dfrac{1}{\max(N_k, N_l)}, & \text{nodes } k \text{ and } l \text{ are linked and } k \neq l \\ 0, & \text{nodes } k \text{ and } l \text{ are not linked} \\ 1 - \sum_{l \in N_k, l \neq k} c_{kl}, & k = l \end{cases} \tag{25}$$

where the error at the node is given by the equivalent of equation (7):

$$e_k(i) = d_k(i) - u_{k,i} y_{k,i-1}. \tag{26}$$

In a further embodiment, equation (23) may be modified as:

$$y_k(i+1) = w_k(i) + \mu_k(i) \sum_{l \in N_k} b_{lk} u_l^T(i) e_l(i), \tag{27}$$

where $b_{lk}$ is the combiner weight for the sensed data shared by neighbor nodes of node k.

The node step size $\mu_k$, given by equation (5), is then modified as:

$$\mu_k(i+1) = \alpha \mu_k(i) + \gamma \sum_{l \in N_k} b_{lk} e_l^2(i), \tag{28}$$

where α and γ are the controlling parameters.

The generalized form for the above requires sharing of complete data with neighbor nodes. Since more data is being shared, the generalized methods perform more efficiently. The step-size update in equation (28) uses the instantaneous error energy to vary the step-size. If the instantaneous errors from neighbor nodes are also shared along with the intermediate update vectors, then equation (28) is modified with:

$$\varepsilon_k(i) = \sum_{l \in N_k} c_{lk} e_l(i), \tag{29}$$

where $\epsilon_k(i)$ is the diffused error for node k. Thus, equation (28) becomes:

$$\mu_k(i+1) = \alpha \mu_k(i) + \gamma \sum_{l \in N_k} b_{lk} \varepsilon_l^2(i). \tag{30}$$

In the following, the diffusion least mean square method is represented as DLMS, the variable step-size least mean square method (given above by equations (23) and (24)) is represented as VSSDLMS. Equations (27) and (28) represent the Generalized VSSDLMS method. Equation (29), along with $\mu_k(i+1)=\alpha\mu_k(i)+\gamma\epsilon_k^2(i)$, represents the New VSSDLMS (or NVSSDLMS) method. Combining equations (27), (28), (29) and (30) results in the Generalized NVSSDLMS method.

Comparing the above with respect to the DLMS method, the VSSDLMS method has one extra update equation for the step-size, which includes three multiplications and one addition per node more than the DLMS method. For the generalized VSSDLMS method, there are $2MN_k$ extra multiplications and $M(N_k-1)$ extra additions in equation (27), and $2N_k+3$ extra multiplications and $N_k$ extra additions in equation (28).

The generalized VSSDLMS algorithm has a total of $2(M+1)N_k+3$ extra multiplications and $(M+1)N_k-M$ extra additions per node. The NVSSDLMS algorithm has a further $N_k$ extra multiplications and $N_k-1$ extra additions per node and the same number of extra computations per node for the generalized NVSSDLMS method. These results are shown in Table 1 below:

TABLE 1

Complexity Comparisons Per Node

| Algorithm | Extra Multiplications | Extra Additions |
|---|---|---|
| VSSDLMS | 3 | 1 |
| Gen VSSDLMS | $2(M + 1)N_k + 3$ | $(M + 1)N_k - M$ |
| NVSSDLMS | $N_k + 3$ | $N_k$ |
| Gen NVSSDLMS | $(2M + 3)N_k + 3$ | $(M + 2)N_k - M - 1$ |

Figure 7:
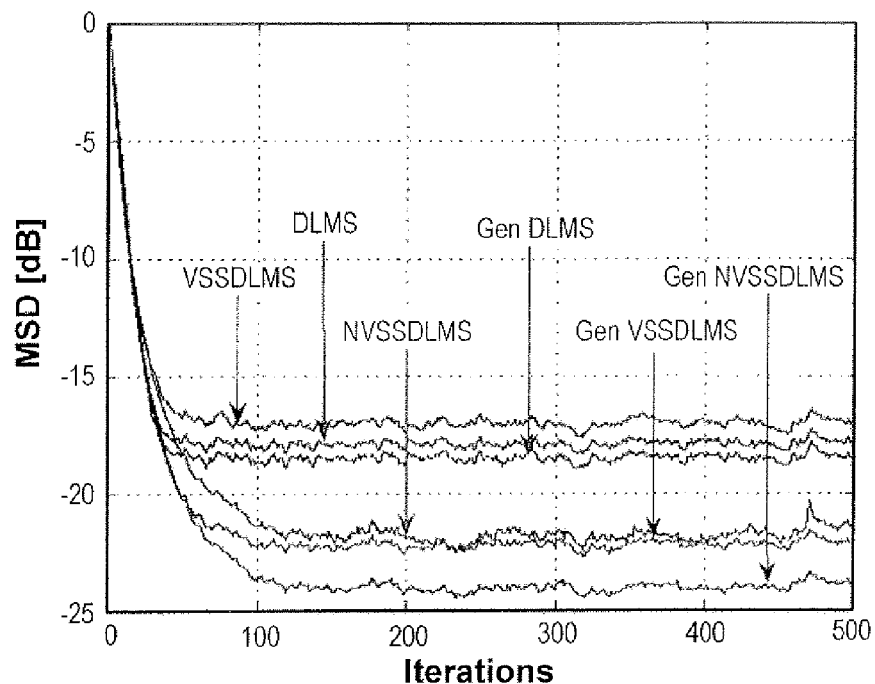
FIG. 7 is a comparison plot of mean square deviation between alternative embodiments of the present variable step-size least mean square method for estimation in adaptive networks according to the present invention, shown with a signal-to-noise ratio of 0 dB.
Figure 8:
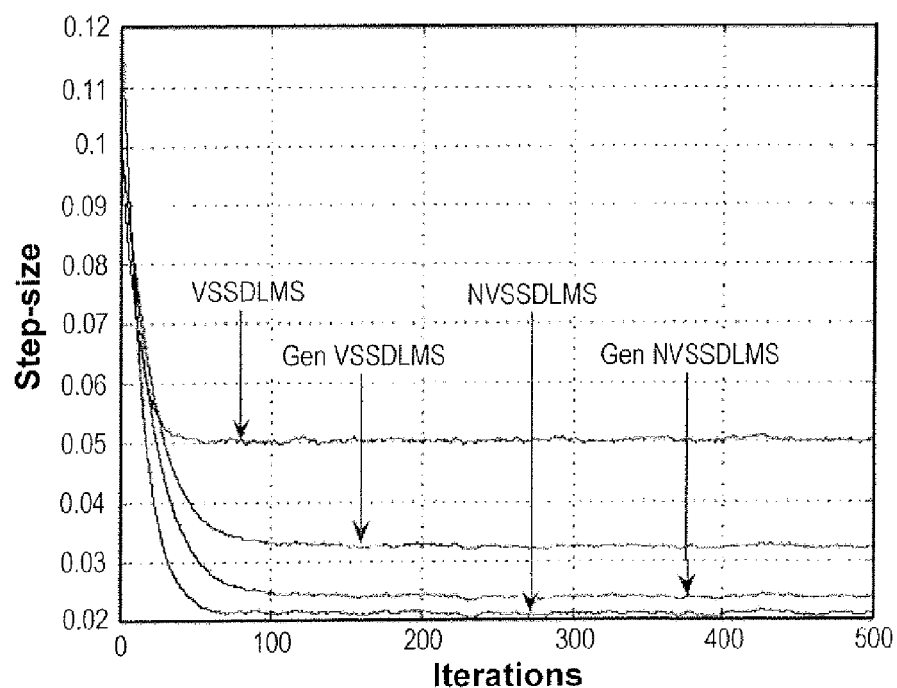
FIG. 8 is a comparison plot of step-size variation vs. iteration number between alternative embodiments of the present variable step-size least mean square method for estimation in adaptive networks according to the present invention, shown with a signal-to-noise ratio of 0 dB.
Figure 9:
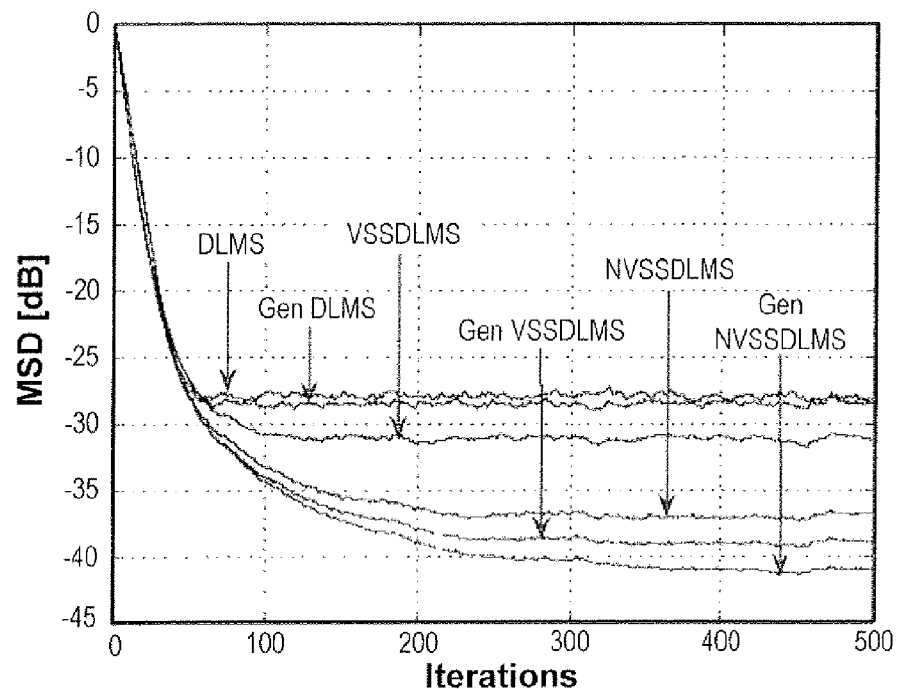
FIG. 9 is a comparison plot of mean square deviation between alternative embodiments of the present variable step-size least mean square method for estimation in adaptive networks according to the present invention, shown with a signal-to-noise ratio of 10 dB.
Figure 10:
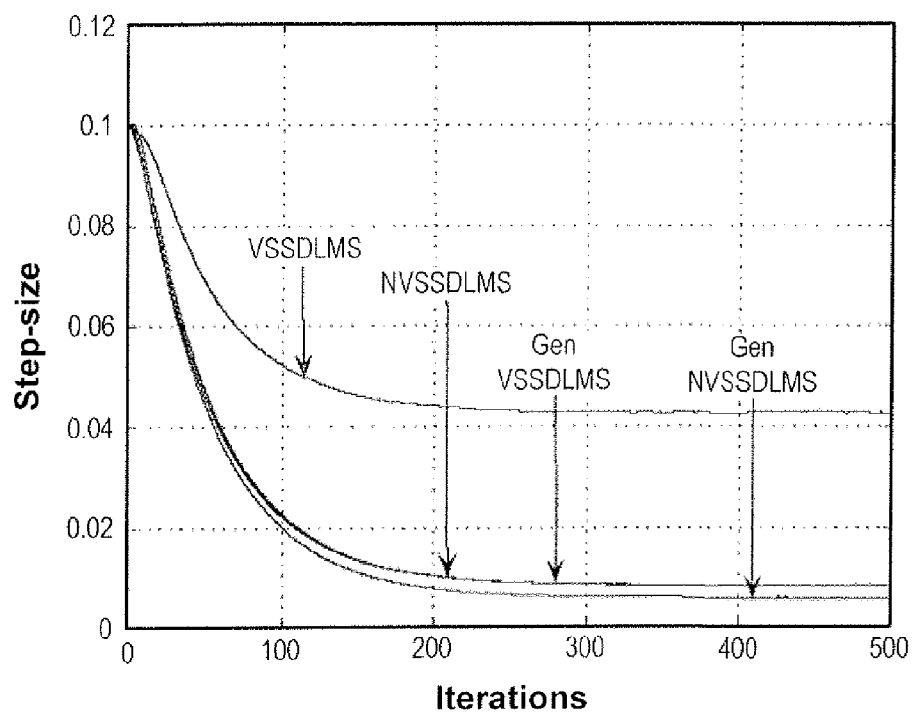
FIG. 10 is a comparison plot of step-size variation vs. iteration number between alternative embodiments of the present variable step-size least mean square method for estimation in adaptive networks according to the present invention, shown with a signal-to-noise ratio of 10 dB.

In FIGS. 7-10, the performance of the NVSSDLMS method is compared with the DLMS method and the VSSDLMS method. A network of twenty nodes is used. Results are shown for signal-to-noise ratio (SNR) values of 0 dB (FIGS. 7 and 8) and 10 dB (FIGS. 9 and 10). The values for the update equation parameters for both methods are adjusted such that they both converge at the same speed. FIGS. 7 and 8 show the results for a SNR of 0 dB, and FIGS. 9 and 10 show the results for a SNR of 10 dB.

As can be seen from FIG. 7, the VSSDLMS method does not perform well at an SNR of 0 dB. The NVSSDLMS method, however, performs quite well. The generalized VSSDLMS algorithm also performs better than the generalized DLMS case, but the generalized NVSSDLMS method outperforms the generalized VSSDLMS method.

FIG. 8 illustrates how the step-size varies. The step-size variation is best for the NVSSDLMS method, as it becomes slightly less than that of the generalized NVSSDLMS method. However, the overall performance of the generalized NVSSDLMS method is better. FIG. 9 shows that the VSSDLMS methods perform better than the DLMS methods, but the NVSSDLMS methods outperform both the VSSDLMS methods. FIG. 10 shows the step-size variation for this case. As can be seen from FIG. 10, the step-size performance for all methods is similar to mean square deviation (MSD) performance.

It is to be understood that the present invention is not limited to the embodiments described above, but encompasses any and all embodiments within the scope of the following claims.

We claim:

1. A system for performing variable step-size diffusion least mean square estimation for an adaptive network, the adaptive network having N nodes, and for each node k, a number of neighbors of node k given by $N_k$, including the node k, wherein k is an integer between one and N, the system comprising:

a processor;

computer readable memory coupled to the processor;

a user interface coupled to the processor;

a display; and software stored in the memory and executable by the processor, the software having:

means for establishing an integer i and initially setting i=1;

means for calculating an output of the adaptive network at each node k as $d_k(i)=u_{k,i}w^0+v_k(i)$, wherein $u_{k,i}$ represents a known regressor row vector of length M, $w^0$ represents an unknown column vector of length M and $v_k(i)$ represents noise in the adaptive network, wherein M is an integer;

means for calculating an error value $e_k(i)$ at each node k as $e_k(i)=d_k(i)-u_{k,i}y_{k,i-1}$, wherein $y_{k,i}$ represents an estimate of an output vector for each node k at iteration i;

means for calculating a diffused error value $\epsilon_k(i)$ at each node k as $$\varepsilon_k(i) = \sum_{l \in N_k} c_{lk} e_l(i),$$

where l is an integer, $c_{lk}$ is a combiner coefficient equal to $$\frac{1}{\max(N_k, N_l)}$$

when nodes k and l are linked and k does not equal l, $c_{lk}$ is equal to 0 when nodes k and l are not linked, and $c_{lk}$ is equal to $$1 - \sum_{l \in N_k/\{k\}} c_{kl}$$

when k equals l;

means for calculating a node step size $\mu_k$ for each node k as $$\mu_k(i) = \alpha\mu_k(i-1) + \gamma \sum_{l \in N_k} b_{lk}\varepsilon_l^2(i),$$

where $\alpha$ and $\gamma$ are unitless, selectable parameters and $b_{lk}$ is a combiner weight for sensed data shared by neighbor nodes of node k;

means for calculating a local estimate for each node neighboring node k, $f_{k,i}$, for each node k as $$f_{k,i} = y_{k,i-1} + \mu_k(i) \sum_{l \in N_k} b_{lk} u_l^T(i) e_l(i);$$

means for calculating the estimate of the output vector $y_{k,i}$ for each node k as $$y_{k,i} = \sum_{l=1}^{N_k} c_{lk} f_{l,i};$$

means for setting i=i+1 and recalculating the output of the adaptive network at each node k if $e_k(i)$ is greater than a selected error threshold; and means for establishing a set of output vectors $y_k$ for each node k, wherein $y_k = y_{k,i}$, and storing the set of output vectors in the computer readable memory if $e_k(i)$ is less than or equal to a selected error threshold.

* * * * *